(12) United States Patent
Nagasaka

(10) Patent No.: US 7,038,605 B2
(45) Date of Patent: May 2, 2006

(54) APPARATUS AND METHOD FOR MEASURING NOISE, AND RECORDING MEDIUM

(75) Inventor: Takeshi Nagasaka, Tokyo (JP)

(73) Assignee: Advantest Corporation, Tokyo (JP)

( * ) Notice: Subject to any disclaimer, the term of this patent is extended or adjusted under 35 U.S.C. 154(b) by 0 days.

(21) Appl. No.: 10/399,257

(22) PCT Filed: Sep. 17, 2001

(86) PCT No.: PCT/JP01/08047

§ 371 (c)(1), (2), (4) Date: Jul. 9, 2003

(87) PCT Pub. No.: WO02/33427

PCT Pub. Date: Apr. 25, 2002

(65) Prior Publication Data
US 2004/0039540 A1 Feb. 26, 2004

(30) Foreign Application Priority Data
Oct. 17, 2000 (JP) .............................. 2000-316129

(51) Int. Cl.
H03M 1/18 (2006.01)
G01R 29/26 (2006.01)

(52) U.S. Cl. ..................... 341/139; 702/69; 324/612

(58) Field of Classification Search ............ 702/111, 702/74, 69; 324/612, 613, 614; 341/131, 341/139, 141, 155
See application file for complete search history.

(56) References Cited

U.S. PATENT DOCUMENTS

| | | | |
|---|---|---|---|
| 4,584,560 A * | 4/1986 | McDaniel et al. | 341/139 |
| 4,806,845 A * | 2/1989 | Nakano et al. | 324/613 |
| 6,114,858 A * | 9/2000 | Kasten | 324/616 |
| 6,628,923 B1 * | 9/2003 | Eriksson | 455/63.1 |
| 6,693,439 B1 * | 2/2004 | Liu et al. | 324/613 |

FOREIGN PATENT DOCUMENTS

| | | |
|---|---|---|
| DE | 19635890 A1 | 3/1997 |
| EP | 296822 A2 | 6/1988 |
| JP | 8-248084 A | 9/1996 |

* cited by examiner

Primary Examiner—Howard L. Williams
(74) Attorney, Agent, or Firm—Lowe, Hauptman & Berner, LLP

(57) ABSTRACT

A noise measuring unit 24 measures a noise power based on an output from a digitizer 16 and the amplification factor of a limiter amplifier 12 when an output from a device under test 10 is supplied for the digitizer 16 through the limiter amplifier 12. Since the output from the device under test 10 is supplied through the limiter amplifier 12, the noise component is sufficiently amplified, the carrier component saturates, and thus, the noise measuring unit 24 easily measures the noise power. At this time, the output frequency of the device under test 10 is not multiplied, and thus, it is not necessary to use a down converter or a spectrum analyzer, the C/N ratio can be measured at a high speed or with a simple constitution.

9 Claims, 8 Drawing Sheets

APPARATUS AND METHOD FOR MEASURING NOISE, AND RECORDING MEDIUM

This application is a 371 of PCT/JP01//08047 Sep. 17, 2001.

FIELD OF ART

The present invention relates to measuring the C/N ratio (Carrier to Noise ratio) of a signal provided from a DUT (Device Under Test).

BACKGROUND ART

Conventionally, the C/N ratio of a signal provided from a DUT (Device Under Test) has been measured, and a system configuration for the measuring is shown in FIG. 7.

The frequency of a signal Fs provided from a DUT 102 is multiplied by about a few tens by a multiplier 104. The frequency of a signal Fs×N provided from the multiplier 104 is reduced by a down converter 106 down to a frequency which a digitizer 108 can process, and then, the signal is supplied for the digitizer 108. The digitizer 108 can measure the C/N ratio of the signal Fs×N provided from the multiplier 104. Note that since the C/N ratio is reduced by multiplying the frequency of the signal Fs provided from the DUT 102, the reduced amount is obtained by calculation, and the C/N ratio of the signal Fs provided from the DUT 102 is obtained.

Alternately, the measuring system may be configured as shown in FIG. 8. Though this system is identical to the example above up to the process where the signal provided from the DUT 102 is multiplied by about a few tens by the multiplier 104, the frequency of the signal provided from the multiplier 104 is not reduced, and is processed by a spectrum analyzer 110. The C/N ratio of the signal Fs×N provided from the multiplier 104 can be measured by the spectrum analyzer 110. Note that since the C/N ratio is reduced by multiplying the frequency of the signal Fs provided from the DUT 102, the reduced amount is obtained by calculation, and then, the C/N ratio of the signal Fs provided from the DUT 102 is obtained.

However, since the frequency which the digitizer 108 can handle is generally about a few tens of MHz, the down converter 106 is necessary in the system shown in FIG. 7. The down converter 106 which meets such a high frequency signal as supplied from the multiplier 104 is expensive, and its circuit is complex.

In the system shown in FIG. 8, since the processing speed of the spectrum analyzer 110 itself is generally slow, the overall processing speed also is slow.

In view of the foregoing, the present invention has a purpose of providing an apparatus and the like which can measure the C/N ratio provided from the DUT at a high speed or with a simple constitution.

DISCLOSURE OF THE INVENTION

According to an aspect of the present invention, a noise measuring apparatus includes: a limiter amplifying unit, that provides a signal to be measured in a predetermined range; and a digital data converting unit, that converts the output from the limiter amplifying unit into digital data.

In the noise measuring apparatus constituted as described above, a carrier component in the output from the DUT is relatively large compared with a noise component. Thus, if the limiter amplifying means amplifies the output from the DUT, the noise component becomes larger. Additionally, since the signal after amplifying is provided in a predetermined range, the carrier component saturates, and does not become too large. Therefore, if the output from the limiter amplifying means is converted into digital data by the digital data converting means, since digital data with the increased noise component are obtained, measuring the noise component becomes easy. Consequently, the noise component is measured at a high speed or with a simple constitution.

Note that the predetermined range generally means a one with determined upper limit and lower limit. However, the range may have only a determined upper limit or lower limit if necessary.

The noise measuring apparatus according to the present invention further includes a noise measuring unit, that measures noise based on the output from the digital data converting unit and an amplification factor of the limiter amplifying unit.

The noise measuring apparatus according to the present invention further includes a carrier digital data converting unit, that converts the output from the device under test into digital data.

The noise measuring apparatus according to the present invention further includes an output switching unit, that supplies the digital data converting unit with the output from the limiter amplifying unit or the output from the device under test, wherein the digital data converting unit also serves as the carrier digital data converting unit.

The noise measuring apparatus according to the present invention further includes a carrier measuring unit, that measures the carrier based on the output from the carrier digital data converting unit.

The noise measuring apparatus according to the present invention further includes a noise measuring unit, that measures noise based on the output from the digital data converting unit and the amplification factor of the limiter amplifying unit.

The noise measuring apparatus according to the present invention further includes a C/N ratio calculating unit, that calculates a C/N ratio based on a measured result of the carrier measuring unit and the noise measuring unit.

According to another aspect of the present invention, a noise measuring method includes: a limiter amplifying step of providing a signal to be measured in a predetermined range; and a digital data converting step of converting the output from the limiter amplifying step into digital data.

According to another aspect of the present invention, a computer-readable medium has a program of instructions for execution by the computer to perform a noise measuring process, the noise measuring process including: a limiter amplifying step of providing a signal to be measured in a predetermined range; and a digital data converting step of converting the output from the limiter amplifying step into digital data.

BEST MODE FOR CARRYING OUT THE INVENTION

The following section describes an embodiment of the present invention while referring to drawings.

Figure 1:
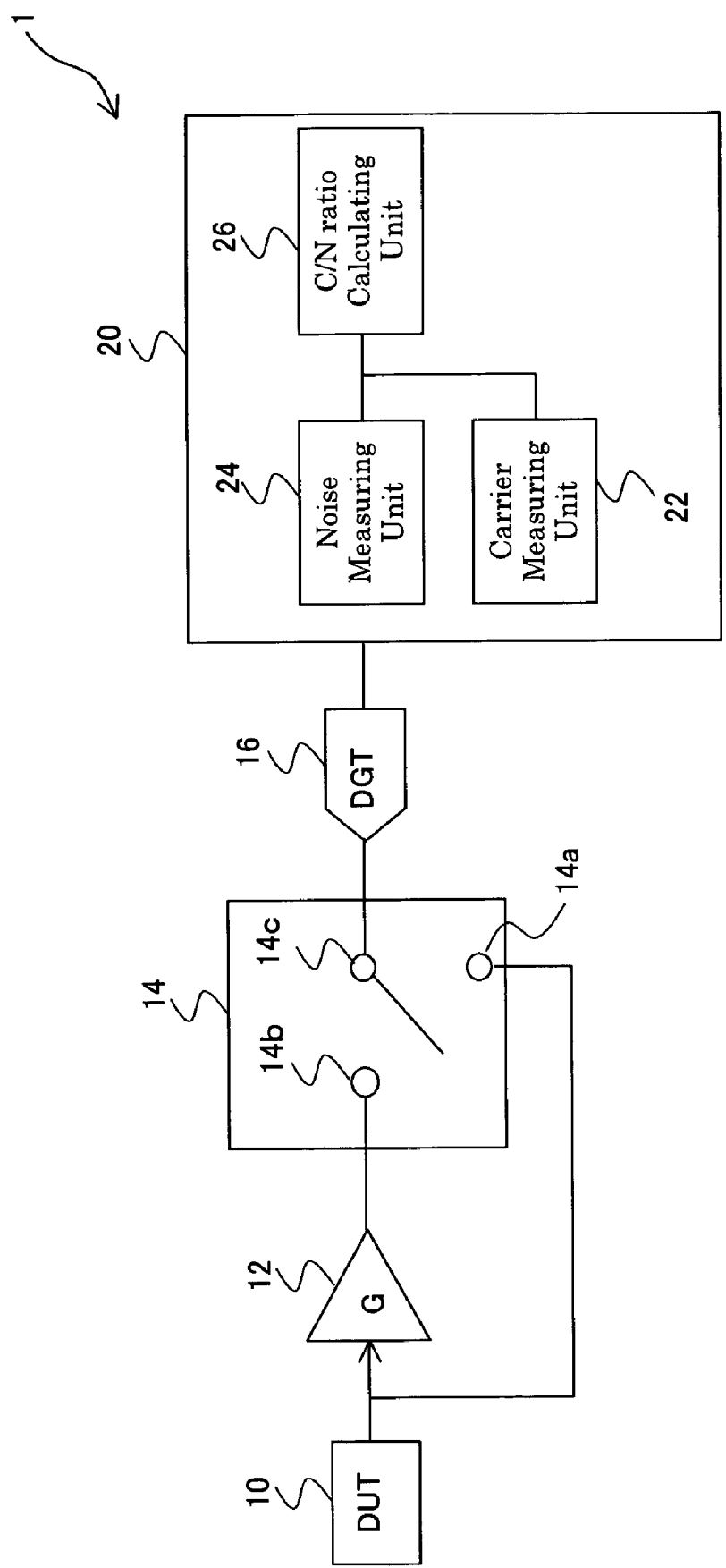
FIG. 1 is a block diagram showing a constitution of a noise measuring apparatus 1 according to an embodiment of the present invention.

FIG. 1 is a block diagram showing a constitution of a noise measuring apparatus 1 according to the embodiment of the present invention. The noise measuring apparatus 1 according to the embodiment of the present invention comprises a DUT (Device Under Test) 10, a limiter amplifier 12, a switch 14, a digitizer 16, and a C/N ratio (Carrier to Noise ratio) measuring unit 20.

The DUT 10 receives a signal to be measured which is not shown, and provides a signal corresponding to the signal to be measured.

Figure 2:
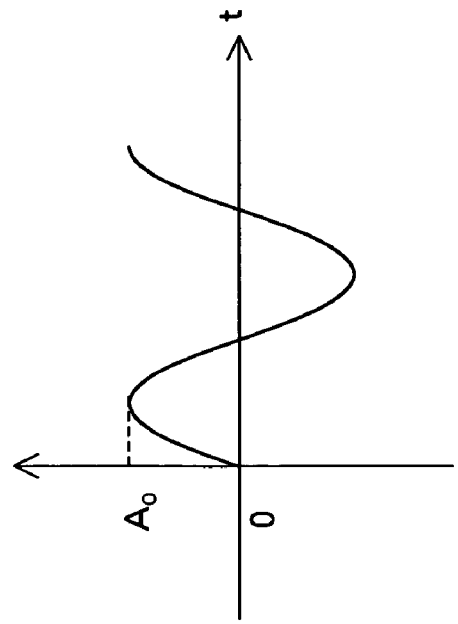
FIG. 2 is a drawing showing an operation of a limiter amplifier 12.
Figure 2:
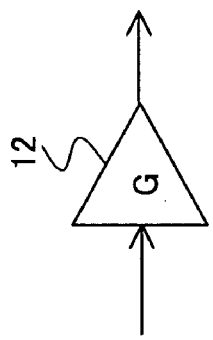
Figure 2:
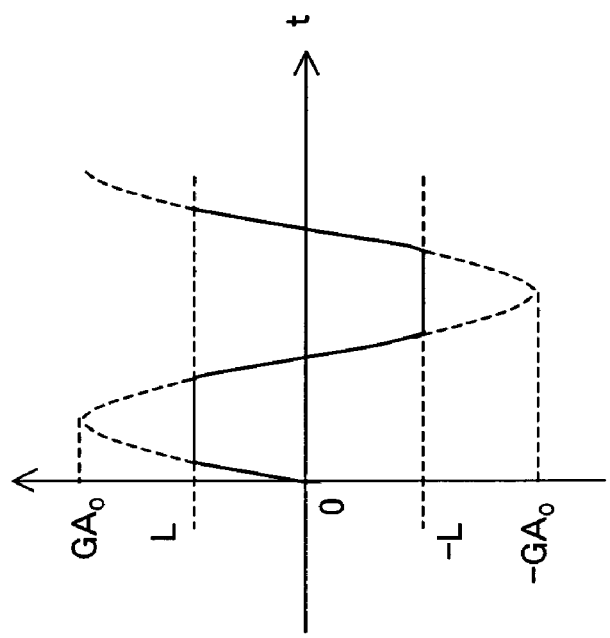

The limiter amplifier 12 amplifies the output from the DUT 10, provides the amplified output, and provides a boundary value of a range when the signal after the amplifying exceeds the range. The limiter amplifier 12 serves as limiter amplifying means. The following section describes the operation of the limiter amplifier 12 while referring to FIG. 2. First, a signal of a sinusoidal wave with the amplitude of $A_0$ is supplied for the limiter amplifier 12. It is assumed that the amplification factor of the limiter amplifier 12 is $G$. If the output from the limiter amplifier 12 were not limited, the output would be a signal of a sinusoidal wave with an amplitude of $GA_0$. Further, when the output from the limiter amplifier 12 is limited to a range from $-L$ to $L$, if the absolute value of the output exceeds $L$, the output is $\pm L$, namely the boundary value of the output range of the limiter amplifier 12. When the absolute value of the output is $L$ or less, the output remains unchanged. Namely, if the input is $A_0 \sin \omega t$, the output from the limiter amplifier 12 is:

$GA_0 \sin \omega t (-L < GA_0 \sin \omega t < L),$ $L(L < GA_0 \sin \omega t),$ or $-L(GA_0 \sin \omega t < -L).$ Note that in the example above, the upper limit (L) and the lower limit (–L) are specified for the output range of the limiter amplifier 12. However, if the output from the device under test 10 is always equal to or more than 0, it is only necessary to specify the upper limit (L) for the range of the output from the limiter amplifier 12. Oppositely, if the output from the device under test 10 is always equal to or less than 0, it is only necessary to specify the lower limit (–L) for the range of the output from the limiter amplifier 12.

Returning to FIG. 1, the switch 14 connects the output from the DUT 10 or the output from the limiter amplifier 12 with the input to the digitizer 16. The switch 14 has an input terminals 14a and 14b, and an output terminal 14c. The input terminal 14a is connected with the output from the DUT 10. The input terminal 14b is connected with the output from the limiter amplifier 12. The output terminal 14c is connected with the input to the digitizer 16. The switch 14 connects the input terminal 14a and the output terminal 14c with each other, or the input terminal 14b and the output terminal 14c with each other.

The digitizer 16 converts the output from the switch 14 into digital data, and provides the data. When the switch 14 connects the input terminal 14a and the output terminal 14c with each other, the digitizer 16 converts the output from the DUT 10 into digital data. At this time, the digitizer 16 serves as carrier digital data converting means. When the switch 14 connects the input terminal 14b and the output terminal 14c with each other, the digitizer 16 converts the output from the limiter amplifier 12 into digital data. At this time, the digitizer 16 serves as digital data converting means.

Figure 3:
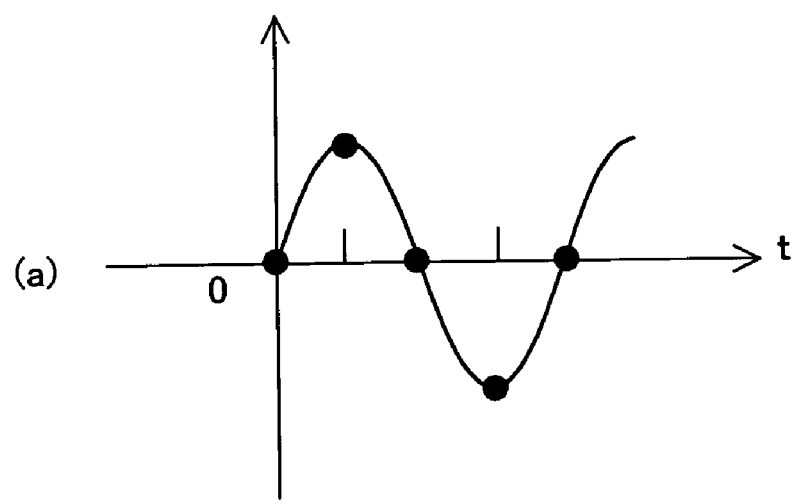
FIG. 3 are drawings showing an operation of a digitizer 16, and include a drawing (FIG. 3(a)) showing a form of sampling an output from a DUT 10, and a drawing (FIG. 3(b)) showing a form of sampling an output from the limiter amplifier 12.
Figure 3:
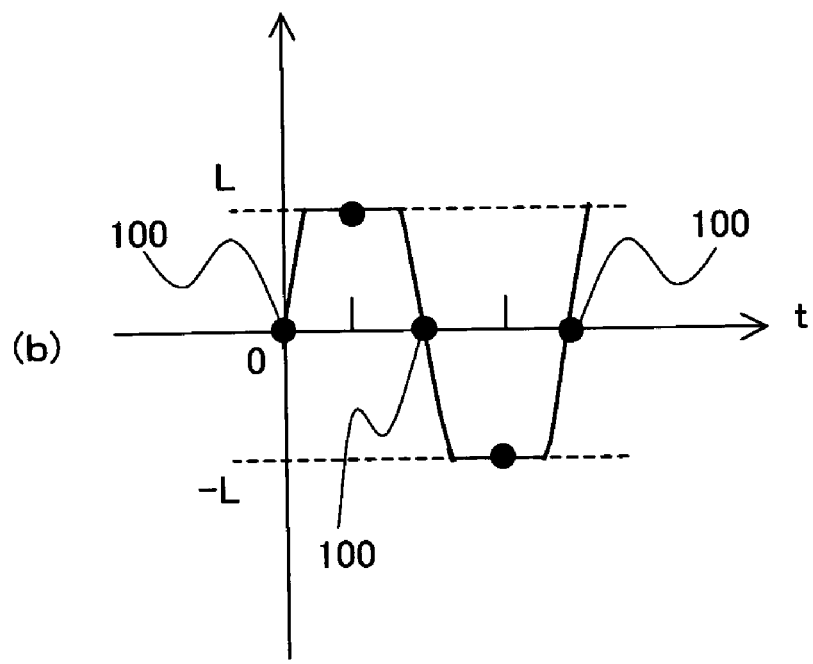

The following section describes the operation of the digitizer 16 while referring to FIG. 3. The digitizer 16 oversamples the output of the DUT 10 or the output of the limiter amplifier 12. For example, FIG. 3(a) shows a form of sampling the output from the DUT 10, and FIG. 3(b) shows a form of sampling the output from the limiter amplifier 12 when the oversampling rate=4. The time interval of the sampling is ¼ of the period of the output from the DUT 10 or the output from the limiter amplifier 12. Namely, the frequency is four times. Note that the sampling of the output from the limiter amplifier 12 is conducted only in the neighborhood of the level 0 which is not clamped by the limiter amplifier 12. For example, the sampling is conducted only at points 100 in FIG. 3(b).

While the digitizer 16 serves as the carrier digital data converting means and the digital data converting means, a digitizer serving as the carrier digital data converting means and a digitizer serving as the digital data converting means may be provided independently.

The C/N ratio measuring unit 20 comprises a carrier measuring unit 22, a noise measuring unit 24, and a C/N ratio calculating unit 26.

The carrier measuring unit 22 measures the power of the carrier signal based on the output from the carrier digital data converting means. Namely, it measures the power of the carrier signal based on the output from the digitizer 16 when the digitizer 16 converts the output from the DUT 10 into the digital data.

Figure 4:
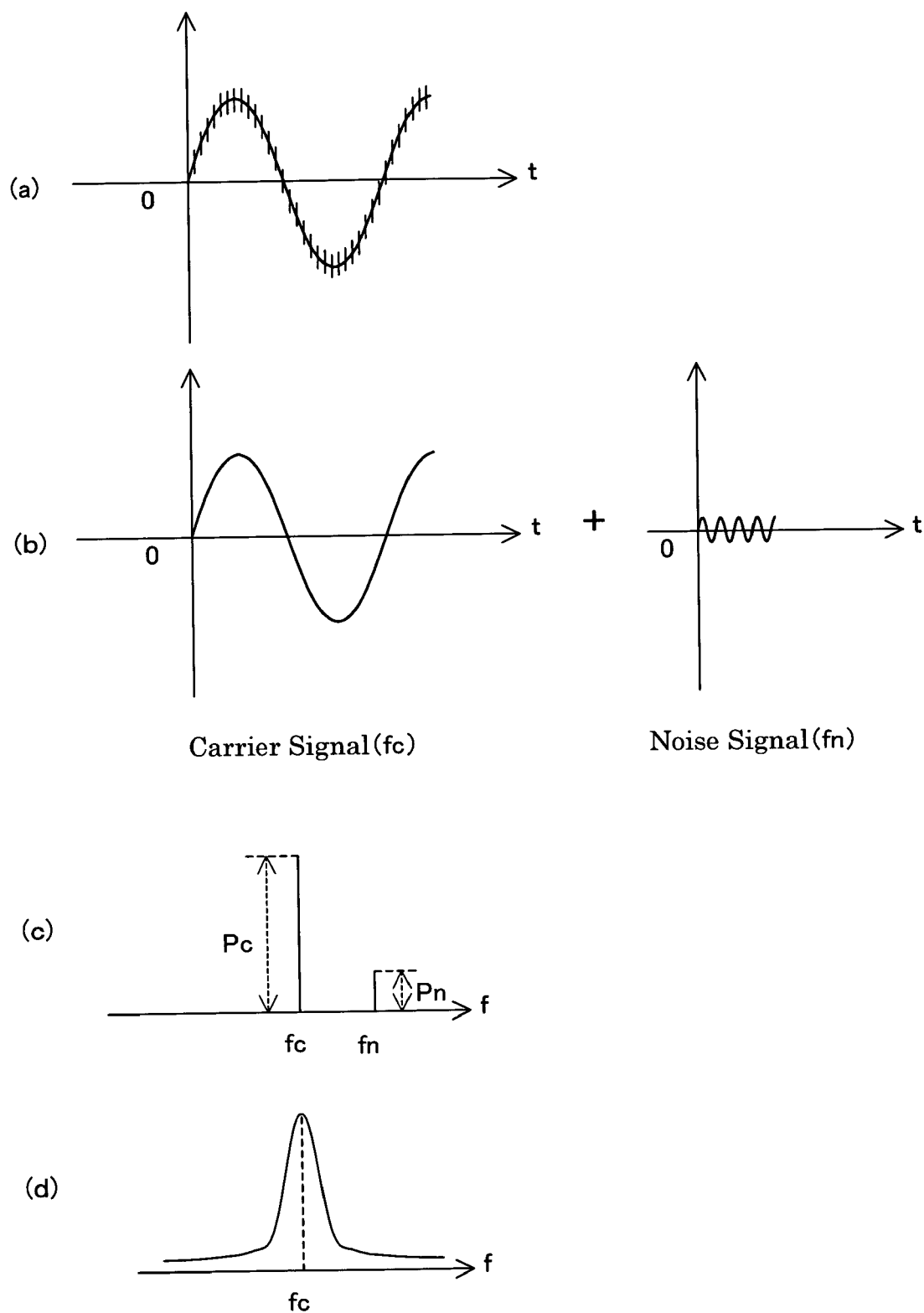
FIG. 4 are drawings showing a method of measuring power of a carrier signal, and include a drawing showing an output from the digitizer 16 (FIG. 4(a)), a drawing showing separated carrier component and noise component (FIG. 4(b)), a drawing showing the output from the digitizer 16 transformed into the frequency domain (FIG. 4(c)), and a drawing showing a relationship between the actual frequency and the power (FIG. 4(d))

The following section describes a measuring method for the power of the carrier signal while referring to FIG. 4. FIG. 4(a) shows the output from the digitizer 16 when the digitizer 16 converts the output from the DUT 10 into the digital data. As shown in FIG. 4(a), the output from the digitizer 16 is a signal of the carrier signal superimposed by a minute noise. It is assumed that the frequency of the carrier component is fc. It is also assumed that the noise component has a constant frequency, and the frequency of the noise component is fn. As a result, as shown in FIG. 4(b), the output from the digitizer 16 is divided into the carrier component (frequency: fc) and the noise component (frequency fn). When the output from the digitizer 16 is Fourier-transformed, and the powers for the respective frequencies are obtained, there exist powers at the frequency fc and the frequency fn as shown in FIG. 4(c). If the power at the frequency fc is Pc, and the power at the frequency fn is Pn, the power of the carrier frequency is Pc. Thus, the power of the carrier signal is obtained by Fourier-transforming the output from the digitizer 16, and obtaining the power at the frequency of fc. Note that since the frequency of the noise component has a width, the actual relationship between the frequency and the power takes the form shown in FIG. 4(d). However, the principle of obtaining the power of the carrier signal remains the same. Also, since the amplitude of the noise signal is small as shown in FIG. 4(d), it is difficult to measure it.

The noise measuring unit 24 measures the power of the noise based on the output from the digital data converting means. Namely, the power of the noise is measured based on the output from the digitizer 16 when the digitizer 16 converts the output from the limiter amplifier 12 into the digital data.

Figure 5:
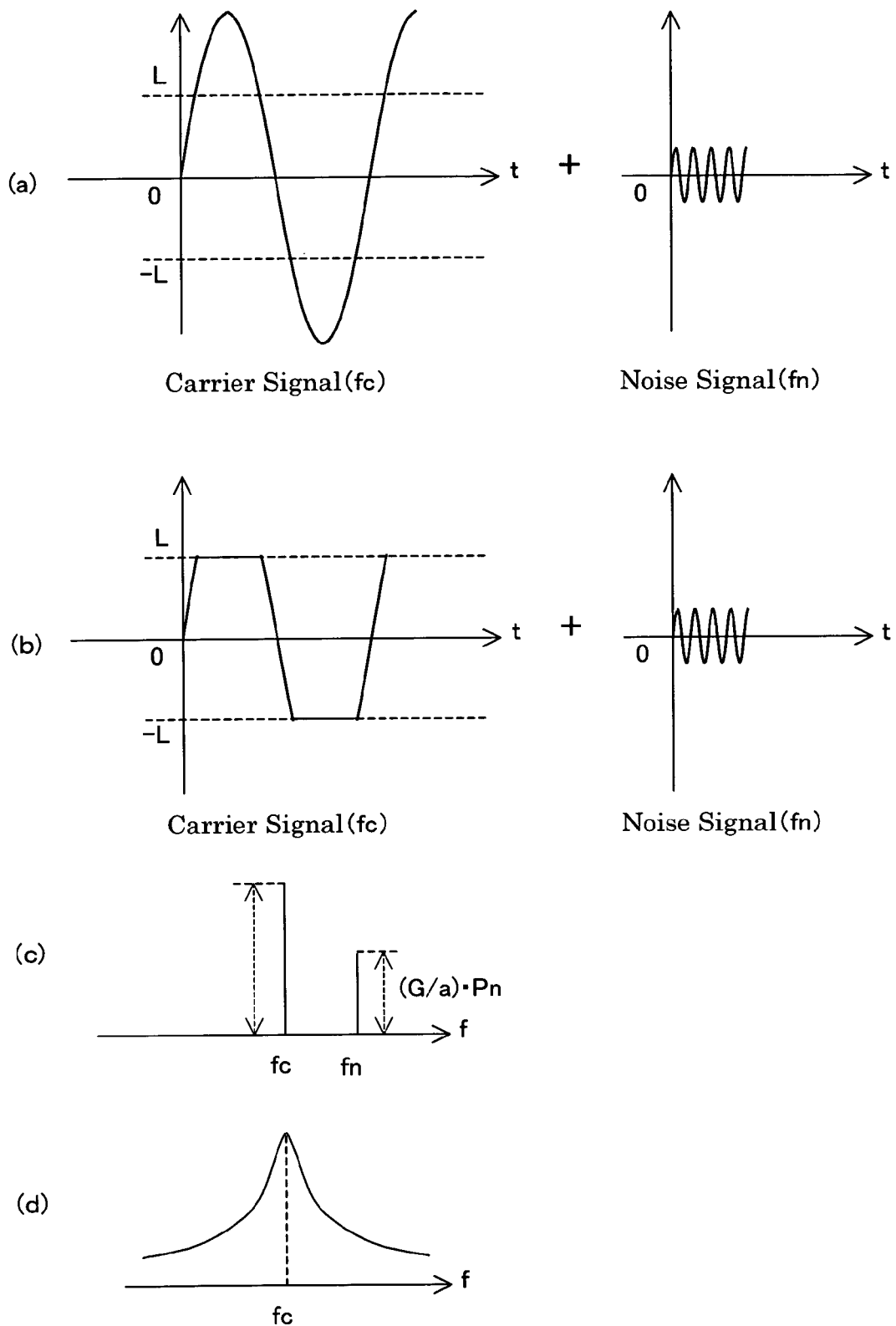
FIG. 5 are drawings showing a measuring method for noise power, and include a drawing showing the output from the digitizer 16 when it is assumed that the output from the limiter amplifier 12 is not limited (FIG. 5(a)), a drawing showing the output from the digitizer 16 when the output from the limiter amplifier 12 ranges from $-L$ to $L$ (FIG. 5(b)), a drawing showing the output from the digitizer 16 transformed into frequency domain (FIG. 5(c)), and a drawing showing a relationship between the actual frequency and the power (FIG. 5(d))

The following section describes a measuring method for the power of the noise while referring to FIG. 5. First, it is assumed that the frequency of the carrier component is fc. It is also assumed that the noise component has a constant frequency, and the frequency of the noise component is fn. FIG. 5(a) shows the output from the digitizer 16 when the limiter amplifier 12 does not limit the output, and the digitizer 16 converts the output from the limiter amplifier 12 into the digital data. Note that the output has already been divided into the carrier component (frequency: fc) and the noise component (frequency: fn) in the drawing. The noise component is multiplied by G/a compared with that of the output directly from the DUT 10. Note that (a) is an oversampling rate of the digitizer 16. However, since the carrier component is multiplied by G/a, the C/N ratio remains the same, and it is still difficult to measure the noise power.

FIG. 5(b) shows the output from the digitizer 16 when the output of the limiter amplifier 12 ranges from −L to L, and the output from the limiter amplifier 12 is converted into the digital data by the digitizer 16. Though the carrier component saturates since the output is limited to the predetermined range, the noise component does not saturate. Or, even if the noise component saturates, the degree of its saturation is lower than that of the noise component. Note that though the L can be the same as the amplitude $A_0$ of the carrier component, this value can be set arbitrarily as long as the limiter amplifier 12 is not damaged. In this way, when the carrier component saturates, the dynamic range for measuring the noise power is multiplied by 2 G/a compared with the case where the noise power is measured based on the output from the DUT 10.

Then, after the output from the digitizer 16 is Fourier-transformed, and the powers are obtained for the respective frequencies, certain powers exist at the frequency of fc and the frequency of fn as shown in FIG. 5(c). Here, the power at the frequency of fn is (G/a)·Pn. Thus, the power of the noise is obtained by Fourier-transforming the output from the digitizer 16, obtaining the power at the frequency of fn, and dividing the obtained value by G/a. Note that since the frequency of the noise component has a width, the actual relationship between the frequency and the power takes the form shown in FIG. 5(d). However, the principle of obtaining the noise power remains the same.

The C/N ratio calculating unit 26 obtains the C/N ratio based on the measured results from the carrier measuring unit 22 and the noise measuring unit 24. Specifically, the C/N ratio can be obtained by dividing the result measured by the noise measuring unit 24 by the result measured by the carrier measuring unit 22.

Figure 6:
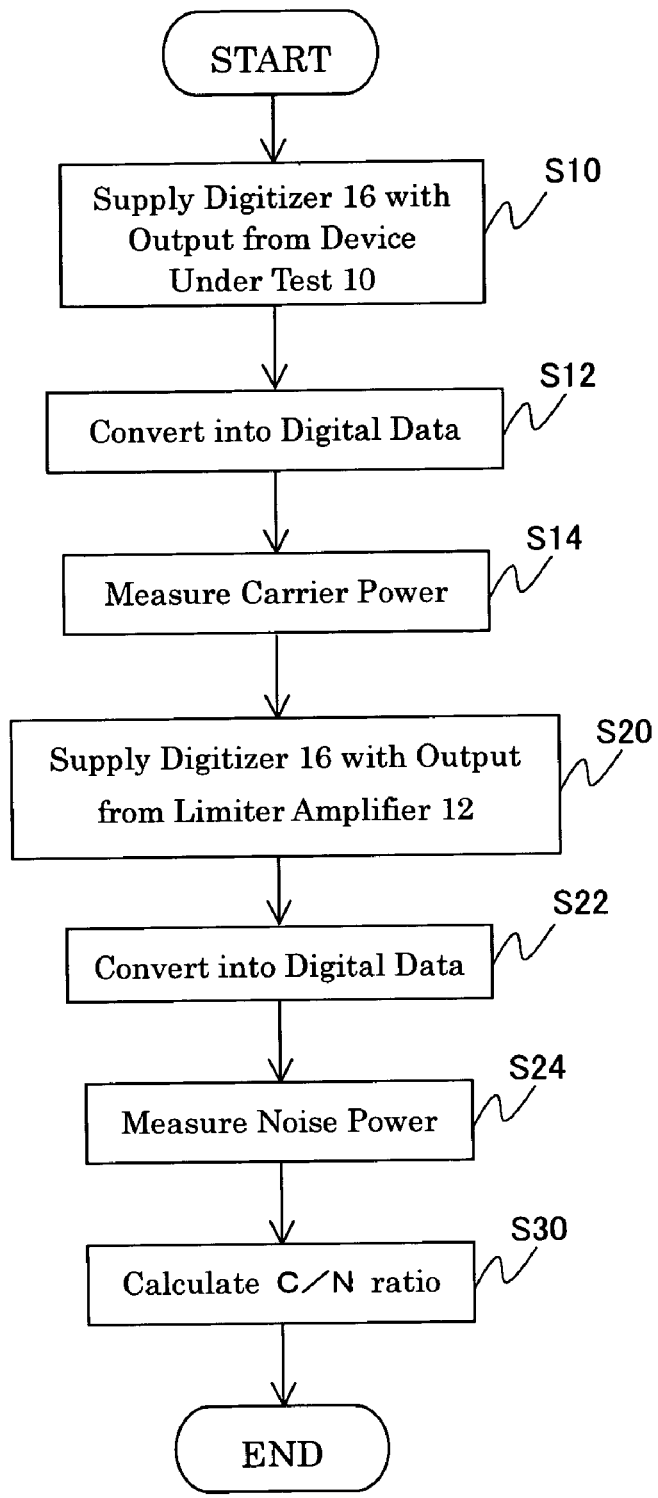
FIG. 6 is a flowchart showing an operation of the embodiment of the present invention.
Figure 7:
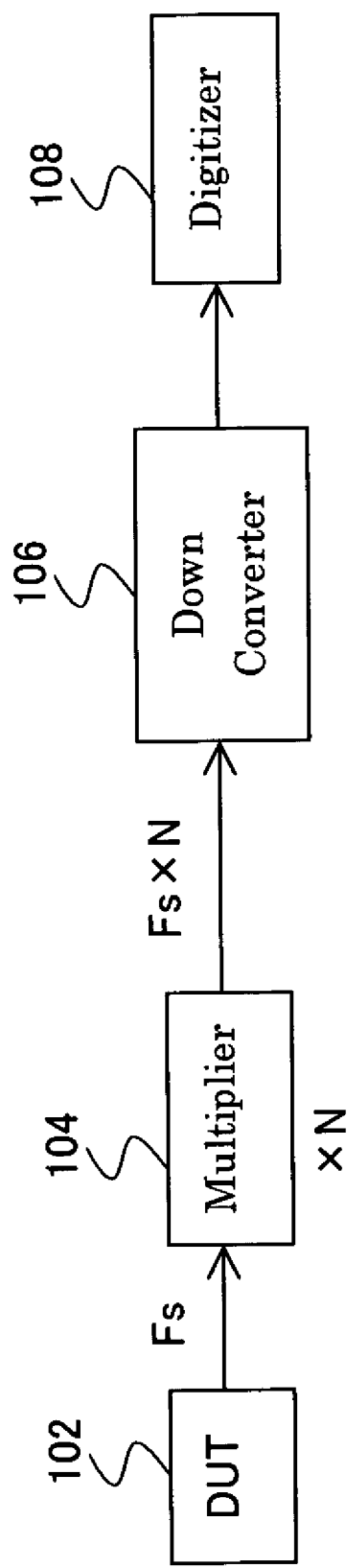
FIG. 7 is a drawing showing a system constitution when the C/N ratio of the signal provided from the DUT is measured in prior art.
Figure 8:
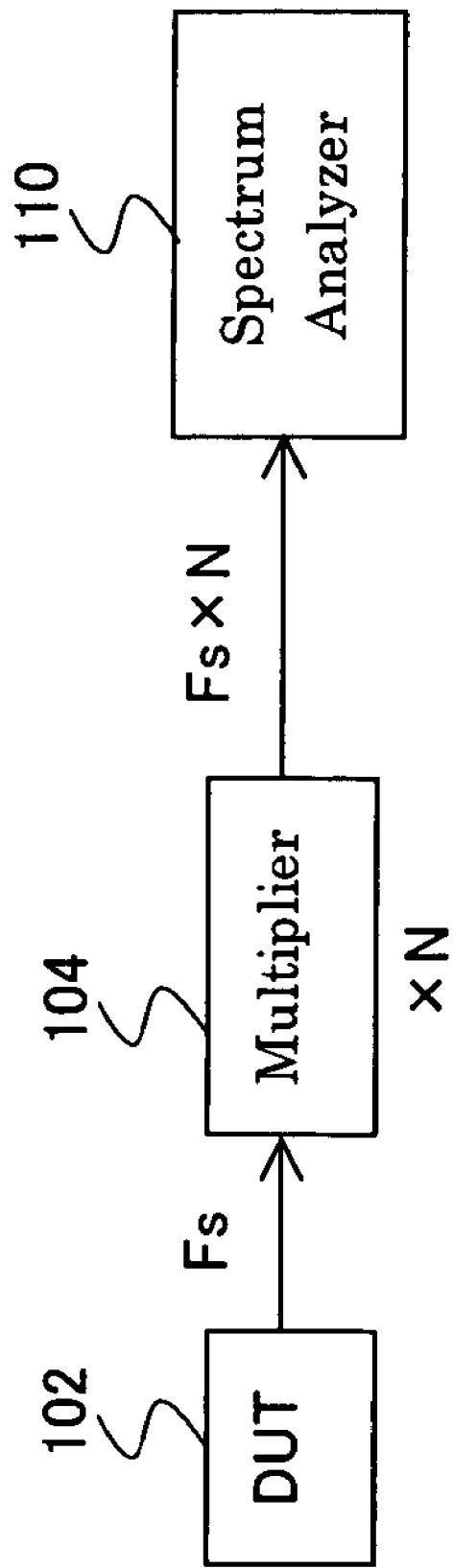
FIG. 8 is a drawing showing another system constitution when the C/N ratio of the signal provided from the DUT is measured in prior art.

The following section describes the operation of the embodiment of the present invention while referring to a flowchart in FIG. 6. First, the input terminal 14a and the output terminal 14c are connected with each other in the switch 14, thereby supplying the digitizer 16 with the output from the DUT 10 (S10). The digitizer 16 converts the output from the DUT 10 into the digital data (S12). Then, the carrier measuring unit 22 measures the power of the carrier signal based on the output from the digitizer 16 (S14).

Then, the input terminal 14b and the output terminal 14c are connected with each other in the switch 14, thereby supplying the digitizer 16 with the output from the limiter amplifier 12 (S20). The digitizer 16 converts the output from the limiter amplifier 12 into the digital data (S22). Then the noise measuring unit 24 measures the power of the noise based on the output from the digitizer 16 (S24).

Finally, the C/N ratio calculating unit 26 obtains the C/N ratio based on the measured results from the carrier measuring unit 22 and the noise measuring unit 24 (S30). Specifically the C/N ratio is obtained by dividing the result measured by the noise measuring unit 24 by the result measured by the carrier measuring unit 22.

With the present invention, the carrier component in the output from the DUT 10 is relatively larger than the noise component. Therefore, if the limiter amplifier 12 amplifies the output from the DUT 10, the noise component increases. In addition, when the signal after the amplifying exceeds the predetermined range (from −L to L), since the output is set to ±L, the carrier component saturates, and does not increase too largely. Thus, after the output from the limiter amplifier 12 is converted into digital data by the digitizer 16, since the digital data with the amplified noise component is obtained, measuring the noise component becomes easy.

With the embodiment of the present invention, the power of the noise component can be measured without multiplying the frequency of the output from the DUT 10. Thus, it is possible to measures the power of the noise component without a down converter or a spectrum analyzer. Therefore, the power of the noise component can be measured with a constitution simpler than the down converter, or at a speed higher than the spectrum analyzer.

The embodiment described above can be realized as described below. A media reading apparatus of a computer comprising a CPU, a hard disk, and the media (such as floppy disk and a CD-ROM) reading apparatus reads a medium recording a program for realizing the individual parts described above, and the program is installed on the hard disk. With this method, the function described above can be realized.

With the present invention, the carrier component in the output from the DUT is relatively larger than the noise component. Therefore, if the limiter amplifying means amplifies the output from the DUT, the noise component increases. In addition, when the signal after the amplifying exceeds the predetermined range, since the output is set to the boundary value of the range, the carrier component saturates, and does not increase too largely. Thus, after the output from the limiter amplifying means is converted into digital data by the digital data converting means, since the digital data with the amplified noise component is obtained, measuring the noise component becomes easy. Consequently, the noise component can be measured at a high speed or with a simple constitution.

The invention claimed is:

1. A noise measuring apparatus, comprising:
   a limiter amplifying unit that amplifies a signal to be measured to output an amplified signal in a predetermined range; and
   a digital data converting unit that converts the amplified signal into digital data,
   wherein the signal to be measured is outputted from a device under test and said predetermined range is determined so that a carrier component of the amplified signal saturates and a noise component of the amplified signal does not saturate.

2. The noise measuring apparatus according to claim 1 further comprising a noise measuring unit that measures noise based on the output from said digital data converting unit and an amplification factor of said limiter amplifying unit.

3. The noise measuring apparatus according to claim 1 further comprising a carrier digital data converting unit that converts the output from said device under test into digital data.

4. The noise measuring apparatus according to claim 3 further comprising an output switching unit that supplies said digital data converting unit with the output from said limiter amplifying unit or the output from said device under test, wherein said digital data converting unit also serves as said carrier digital data converting unit.

5. The noise measuring apparatus according to claim 3 further comprising a carrier measuring unit that measures the carrier based on the output from said carrier digital data converting unit.

6. The noise measuring apparatus according to claim 5 further comprising a noise measuring unit that measures noise based on the output from said digital data converting unit and the amplification factor of said limiter amplifying unit.

7. The noise measuring apparatus according to claim 6 further comprising a C/N ratio calculating unit that calculates a C/N ratio based on a measured result of said carrier measuring unit and said noise measuring unit.

8. A noise measuring method, comprising:
   a limiter amplifying step of amplifying a signal to be measured to output an amplified signal in a predetermined range; and
   a digital data converting step of converting the amplified signal into digital data,
   wherein the signal to be measured is outputted from a device under test and said predetermined range is determined so that a carrier component of the amplified signal saturates and a noise component of the amplified signal does not saturate.

9. A computer-readable medium having a program of instructions for execution by the computer to perform a noise measuring process, said noise measuring process comprising:
   a limiter amplifying step of amplifying a signal to be measured to output an amplified signal in a predetermined range; and
   a digital data converting step of converting the amplified signal into digital data,
   wherein the signal to be measured is outputted from a device under test and said predetermined range is determined so that a carrier component of the amplified signal saturates and a noise component of the amplified signal does not saturate.

* * * * *